United States Patent
He et al.

(10) Patent No.: US 9,882,006 B2
(45) Date of Patent: *Jan. 30, 2018

(54) SILICON GERMANIUM FIN CHANNEL FORMATION

(71) Applicants: INTERNATIONAL BUSINESS MACHINES CORPORATION, Armonk, NY (US); STMicroelectronics, Inc., Coppell, TX (US)

(72) Inventors: Hong He, Schenectady, NY (US); Nicolas Loubet, Guilderland, NY (US); Junli Wang, Singerlands, NY (US)

(73) Assignees: INTERNATIONAL BUSINESS MACHINES CORPORATION, Armonk, NY (US); STMICROELECTRONICS, INC., Coppell, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/340,624

(22) Filed: Nov. 1, 2016

(65) Prior Publication Data
US 2017/0047406 A1     Feb. 16, 2017

Related U.S. Application Data

(63) Continuation of application No. 14/800,381, filed on Jul. 15, 2015.

(51) Int. Cl.
*H01L 29/10* (2006.01)
*H01L 29/161* (2006.01)
(Continued)

(52) U.S. Cl.
CPC .... *H01L 29/1054* (2013.01); *H01L 21/02236* (2013.01); *H01L 21/02532* (2013.01); *H01L 21/02592* (2013.01); *H01L 21/2256* (2013.01); *H01L 21/31116* (2013.01); *H01L 29/161* (2013.01); *H01L 29/167* (2013.01); *H01L 29/66545* (2013.01); *H01L 29/66795* (2013.01);
(Continued)

(58) Field of Classification Search
None
See application file for complete search history.

(56) References Cited

U.S. PATENT DOCUMENTS 5,461,250 A   10/1995 Burghartz et al.
5,847,419 A   12/1998 Imai et al.
(Continued)

OTHER PUBLICATIONS

List of IBM Patents or Patent Applications Treated as Related dated Nov. 1, 2016, 2 pages.
(Continued)

*Primary Examiner* — Whitney T Moore
(74) *Attorney, Agent, or Firm* — Tutunjian & Bitetto, P.C.; Vazken Alexanian

(57) ABSTRACT

A method for channel formation in a fin transistor includes removing a dummy gate and dielectric from a dummy gate structure to expose a region of an underlying fin and depositing an amorphous layer including Ge over the region of the underlying fin. The amorphous layer is oxidized to condense out Ge and diffuse the Ge into the region of the underlying fin to form a channel region with Ge in the fin.

7 Claims, 9 Drawing Sheets

(51) Int. Cl.
    *H01L 29/66*     (2006.01)
    *H01L 21/225*     (2006.01)
    *H01L 21/311*     (2006.01)
    *H01L 21/02*     (2006.01)
    *H01L 29/78*     (2006.01)
    *H01L 29/167*     (2006.01)

(52) U.S. Cl.
    CPC ...... *H01L 29/66818* (2013.01); *H01L 29/785* (2013.01)

(56) References Cited

U.S. PATENT DOCUMENTS

| | | |
|---|---|---|
| 6,391,695 B1 | 5/2002 | Yu |
| 6,482,705 B1 | 11/2002 | Yu |
| 6,787,424 B1 | 9/2004 | Yu |
| 6,969,870 B2 | 11/2005 | Kubo et al. |
| 7,993,999 B2 | 8/2011 | Basker et al. |
| 8,633,545 B2 | 1/2014 | Lee |
| 9,070,711 B2 | 6/2015 | Xie et al. |
| 2011/0121396 A1 | 5/2011 | Lee |
| 2014/0357060 A1 | 12/2014 | Liu et al. |
| 2016/0064511 A1* | 3/2016 | Cheng ............... H01L 29/6681 438/283 |
| 2016/0247893 A1 | 8/2016 | Xu et al. |

OTHER PUBLICATIONS

List of IBM Patents or Patent Applications Treated as Related dated Dec. 13, 2016, 2 pages.

U.S. Office Action issued in U.S. Appl. No. 15/467,100, dated Nov. 22, 2017, pp. 1-21.

* cited by examiner

SILICON GERMANIUM FIN CHANNEL FORMATION

BACKGROUND

Technical Field

The present invention relates to semiconductor processing, and more particularly to methods and devices for forming a SiGe channel by diffusing Ge from a donor layer.

Description of the Related Art

Many semiconductor devices employ fin structures for the formation of the field effect transistors (finFETs). In some instances, the use of SiGe fins is advantageous; however, SiGe structures formed epitaxially tend to form faceted surfaces, which can include non-uniform Ge profiles within the fin. These faceted surfaces include SiGe in a faceted outer region with a Si material core region. While Si processing is more common, mature and in many cases easier to perform, the use of SiGe can provide performance advantages over Si especially if the Ge is uniformly distributed in the fin structure.

SUMMARY

A method for channel formation in a fin transistor includes removing a dummy gate and dielectric from a dummy gate structure to expose a region of an underlying fin and depositing an amorphous layer including Ge over the region of the underlying fin. The amorphous layer is oxidized to condense out Ge and diffuse the Ge into the region of the underlying fin to form a channel region with Ge in the fin.

Another method for channel formation in a fin transistor includes forming a dummy gate structure on a fin, the dummy gate structure including a dummy dielectric layer, a dummy gate, a cap layer and sidewall spacers; forming source and drain regions on the fin adjacent to the sidewall spacers; forming a fill material over the dummy gate structures and the source and drain regions; recessing the fill material and forming a dielectric layer on the fill material; planarizing the dielectric layer to remove the cap layer and expose the dummy gate; removing the dummy gate and the dummy gate dielectric from the dummy gate structure to expose a region of the fin; depositing an amorphous layer including Ge over the region of the underlying Si fin; and oxidizing the amorphous layer to condense out Ge and diffuse the Ge into the region of the fin to form a channel region including Ge.

A fin field effect transistor includes a Si fin including a central portion between end portions of the fin and a gate structure formed over the central portion of the fin. A SiGe channel region is disposed on the central portion of the fin corresponding to the gate structure. The SiGe channel region includes a facet free SiGe region having Ge atoms diffused into the Si fin and including a same shape as the Si fin outside the central portion. Source and drain regions are formed on or in the fin on opposite sides of the SiGe channel region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
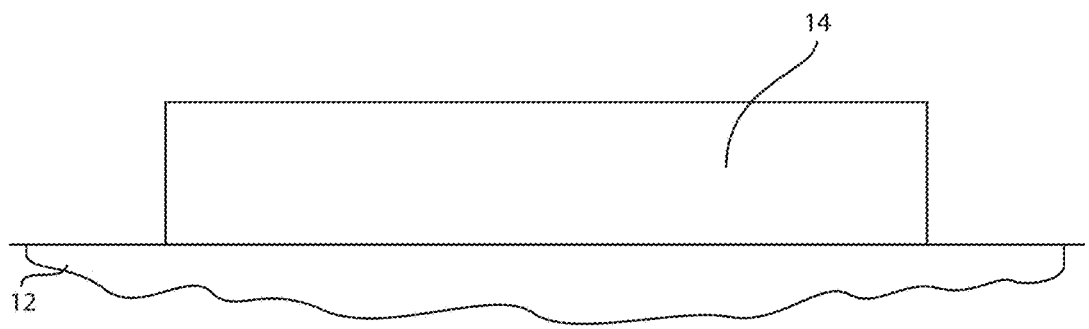
FIG. 1 is a cross-sectional view showing a fin on a substrate in accordance with the present principles.

In accordance with the present principles, devices and methods are described for forming a SiGe channel region without the formation of faceted SiGe regions. In accordance with particularly useful embodiments, a SiGe region is formed using a condensation and diffusion process to introduce Ge atoms into a Si fin. The SiGe is not epitaxially grown and is therefore not subjected to the formation of faceted surfaces, which often create non-uniform Ge profiles in the fin. By forming the Si fin in advance, a shape of the Si fin is maintained as patterned when diffusing Ge into the Si fin. As Ge is diffused into the Si fin, the Si fin is prevented from deforming in the way it would during an epitaxial SiGe growth process. The amorphous layer (and the channel region) can be formed to possess a high percentage of Ge, e.g., 10-100%.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is illustratively shown in cross-section. A fin 14 (or an array of parallel fins) is formed from a monocrystalline material, such as monocrystalline Si. The fin 14 may be patterned from a silicon layer of a silicon on insulator (SOI) substrate 12 (where layer 12 would include a dielectric layer on a base substrate) or may be grown on a bulk silicon substrate (where layer 12 would be a dielectric layer formed on the bulk substrate).

Figure 2:
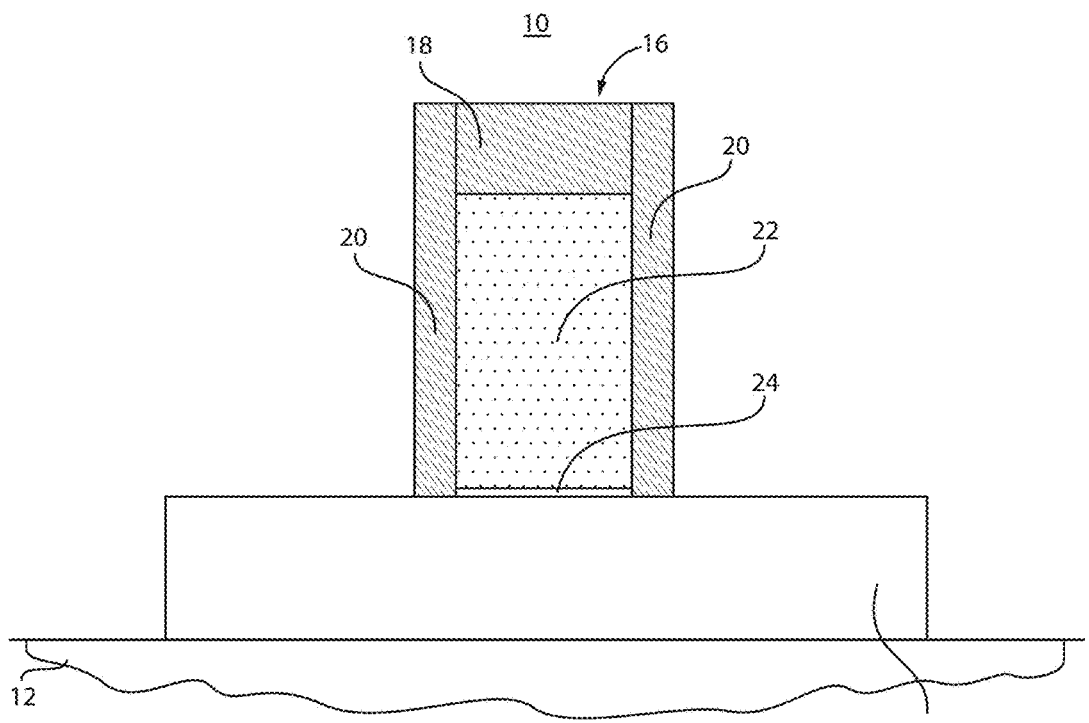
FIG. 2 is a cross-sectional view showing the device in FIG. 1 having a dummy gate structure formed on the fin in accordance with the present principles.

Referring to FIG. 2, a dummy gate structure 16 is formed on or over the fin 14. The dummy gate structure 16 may include a dummy dielectric layer 24, e.g., an oxide, such as a silicon oxide, a dummy gate 22, which may include polysilicon and a cap layer 18, which may include a nitride, e.g., SiN. The dummy dielectric layer 24, dummy gate 22, and the cap layer 18 may be formed as a stack of layers and patterned in a single etch process. A spacer layer is formed and removed from horizontal surfaces to provide sidewalls spacers 20, which may include a nitride, e.g., SiN.

Figure 3:
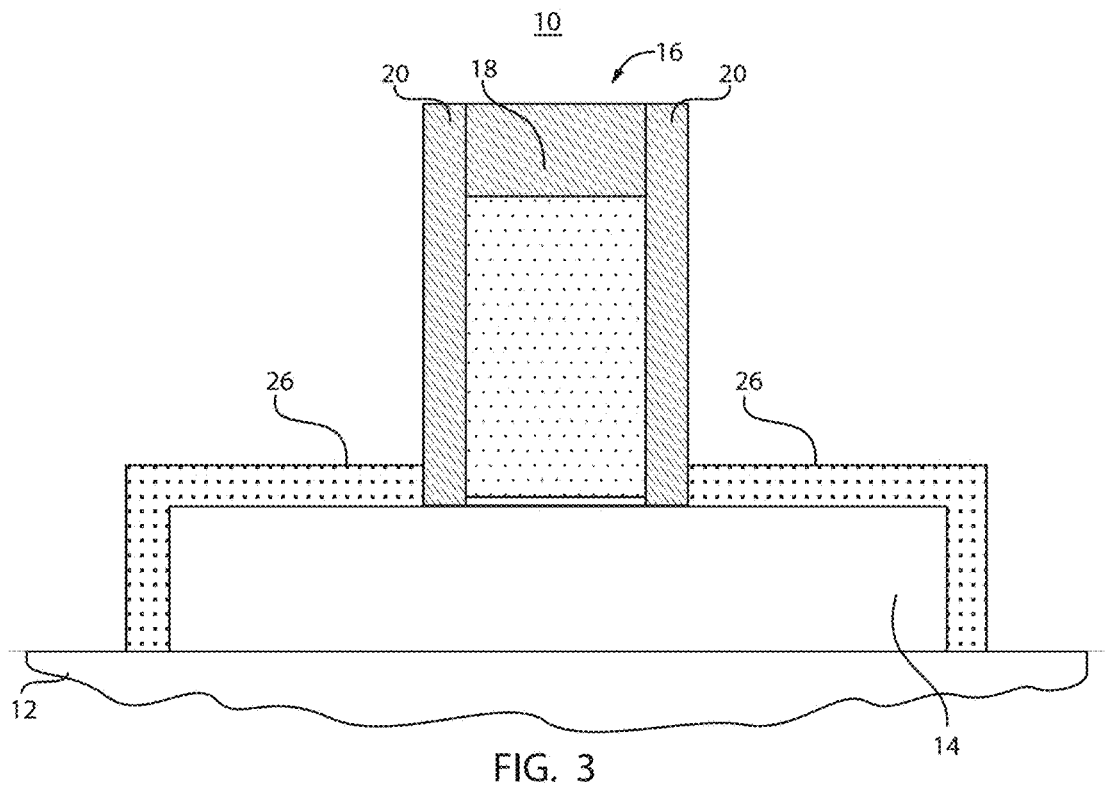
FIG. 3 is a cross-sectional view showing the device in FIG. 2 having epitaxially grown source and drain regions formed on the fin in accordance with the present principles.

Referring to FIG. 3, exposed surfaces of the fin 14 are employed to epitaxially grow source and drain (S/D) regions 26 thereon. The S/D regions 26 may be formed with dopants in an in-situ doping process or the S/D regions 26 may be exposed to a diffusion or implantation doping process or processes depending on the type (conductivity) and concentration needed for proper device operation. The S/D regions 26 may include Si, SiGe or other suitable materials.

Figure 4:
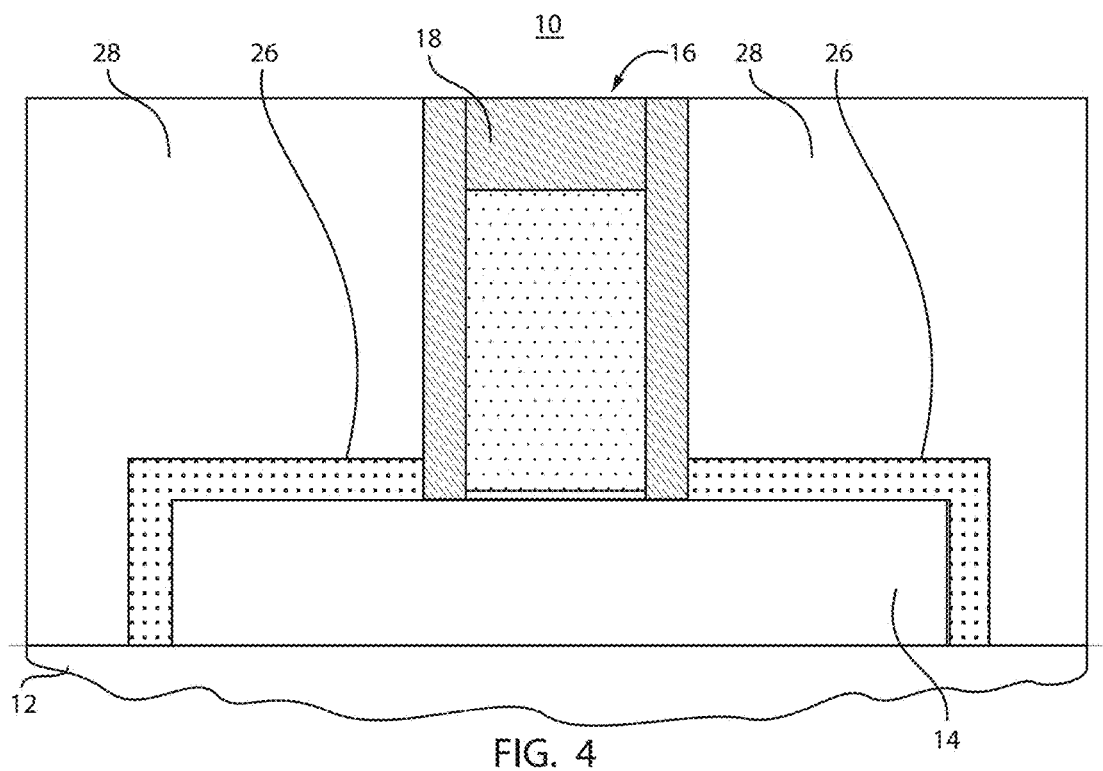
FIG. 4 is a cross-sectional view showing the device in FIG. 3 having a dielectric fill formed on the fin and the dummy gate structure in accordance with the present principles.

Referring to FIG. 4, a dielectric fill 28 is applied over the device 10. The dielectric fill 28 may include a flowable oxide material. The dielectric fill 28 fills in gaps and spaces between fins 14 and around gate structures 16. The dielectric fill 28 is then removed from the top of the gates structures 16 by a planarizing process, such as a chemical mechanical polish (CMP) process.

Figure 5:
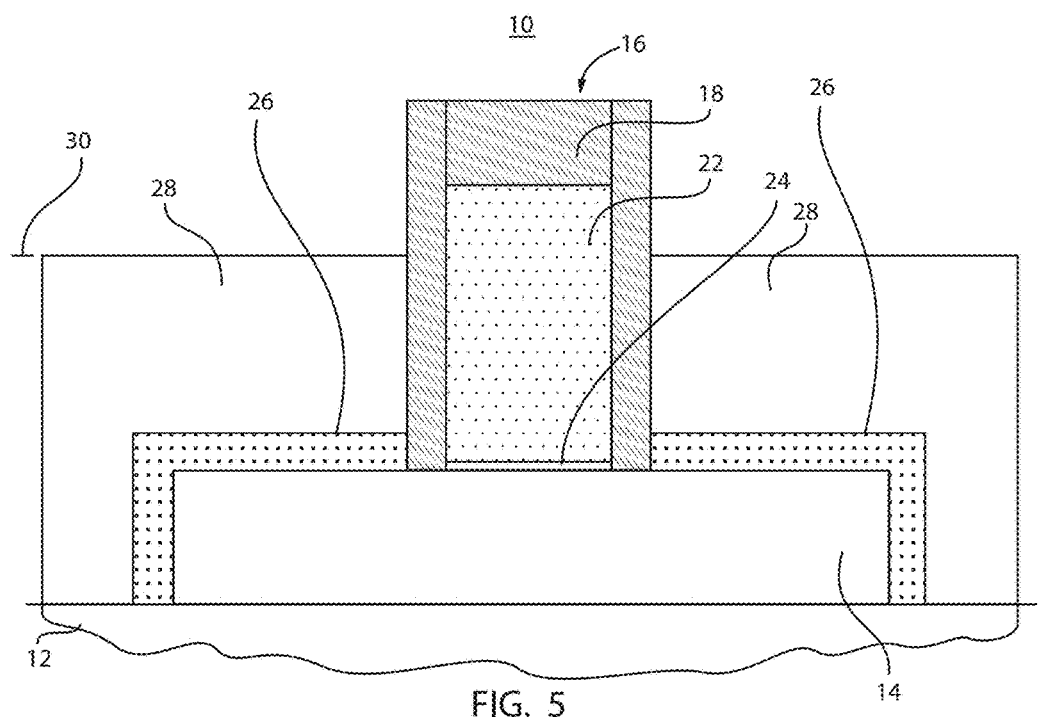
FIG. 5 is a cross-sectional view showing the device in FIG. 4 having the dielectric fill recessed in accordance with the present principles.

Referring to FIG. 5, the dielectric fill 28 is exposed to an etch process to recess the dielectric fill 28 to a height 30 below a top region of the gate structures 16. This enables access to the top portions of the gate structures 16 where the top portion will be removed including the cap layer 18 along with the dummy gate 22 and dummy dielectric 24 to access the underlying fin 14.

Figure 6:
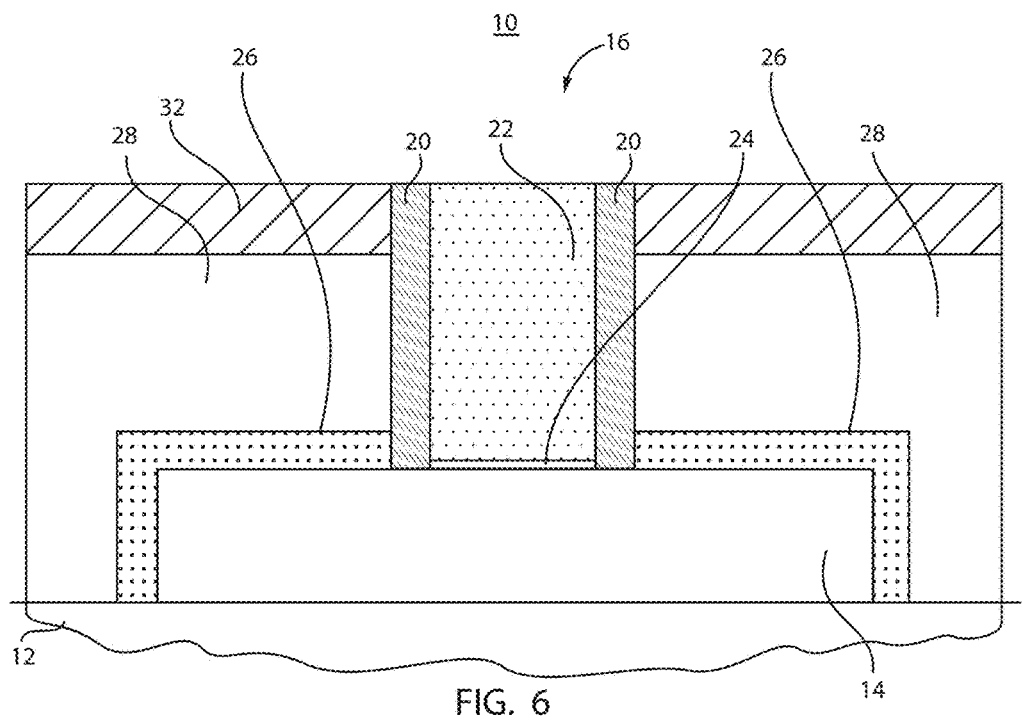
FIG. 6 is a cross-sectional view showing the device in FIG. 5 having a dielectric layer formed on the dielectric fill and a cap layer removed in accordance with the present principles.

Referring to FIG. 6, a dielectric layer 32 is formed, preferably from a same material as the cap layer 18, on the recessed oxide layer 28. The dielectric layer 32 may include SiN. The dielectric layer 32 is planarized to the point when the cap layer 18 is removed to expose the dummy gate 22.

Figure 7:
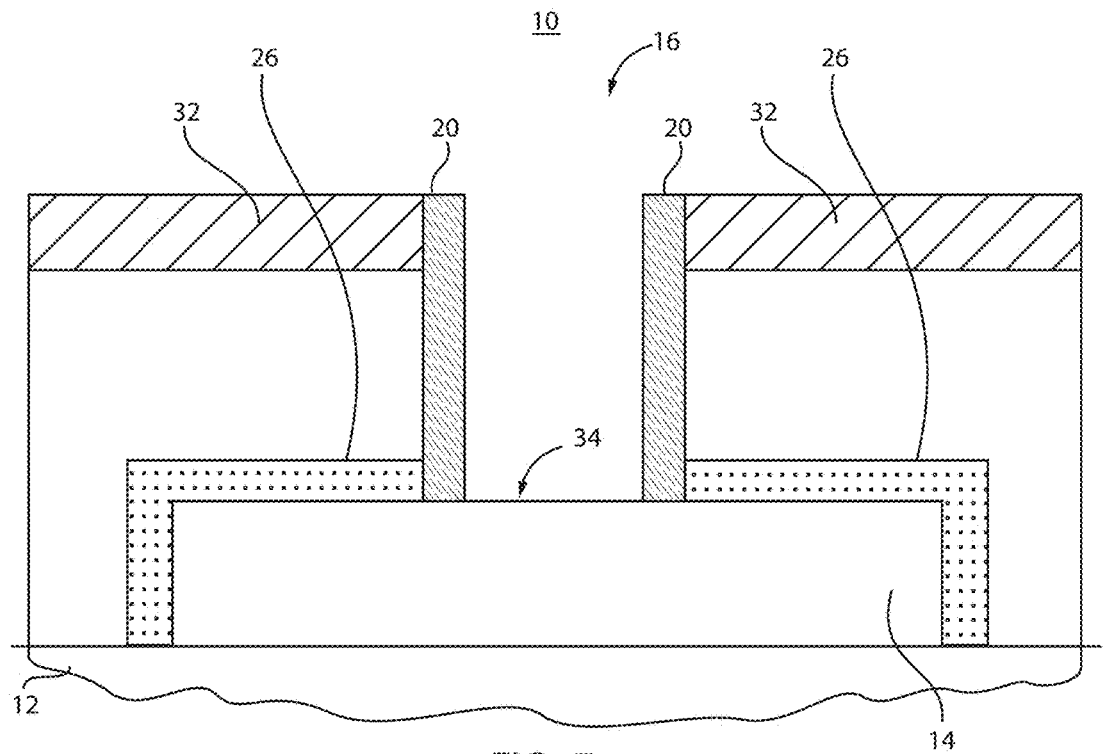
FIG. 7 is a cross-sectional view showing the device in FIG. 6 having a dummy dielectric layer, and dummy gate removed in accordance with the present principles.

Referring to FIG. 7, the dielectric layer 32 and the spacers 20 provide etch protection for a reactive ion etch (RIE) process. The RIE process is employed to remove the dummy gate 22 and the dummy dielectric 24 to expose a portion 34 of the fin 14 through the gate structure 16.

Figure 8:
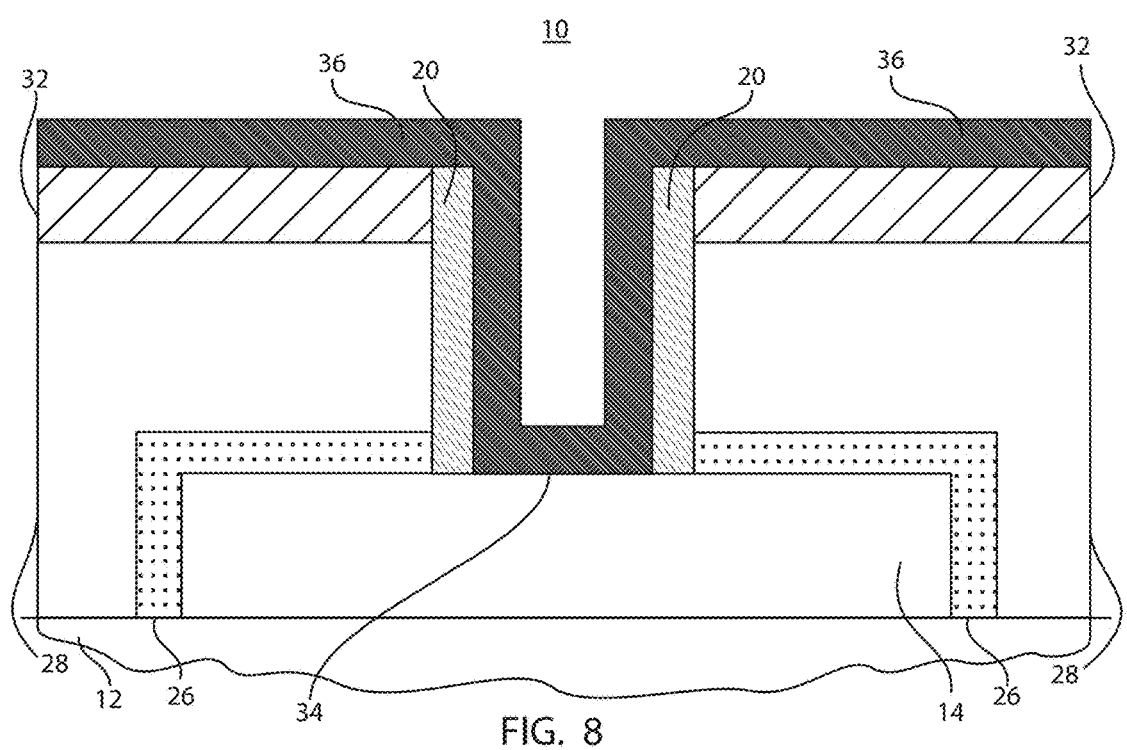
FIG. 8 is a cross-sectional view showing the device in FIG. 7 having an amorphous donor layer conformally formed on the device in accordance with the present principles.

Referring to FIG. 8, a donor layer 36 is deposited over the dielectric layer 32, spacers 20 and the fin 14 at portion 34. The donor layer 36 includes a source of Ge atoms to be diffused into the fin 14 at portion 34 to form a channel for a fin field effect transistor (finFET). The donor layer 36 may include a high percentage of Ge, e.g., 10% to about 100% (pure Ge). In one particularly useful embodiment, the donor layer 36 includes an amorphous SiGe layer. The donor layer 36 may include a thickness of between about 10 nm to about 30 nm, although other thicknesses may be employed. The donor layer 36 may be deposited using a chemical vapor deposition process although other deposition processes may be employed. The donor layer 36 is formed conformally and needs to be in contact with the fin 14 at portion 34 in a channel area, which will become the device channel of the finFET.

Figure 9:
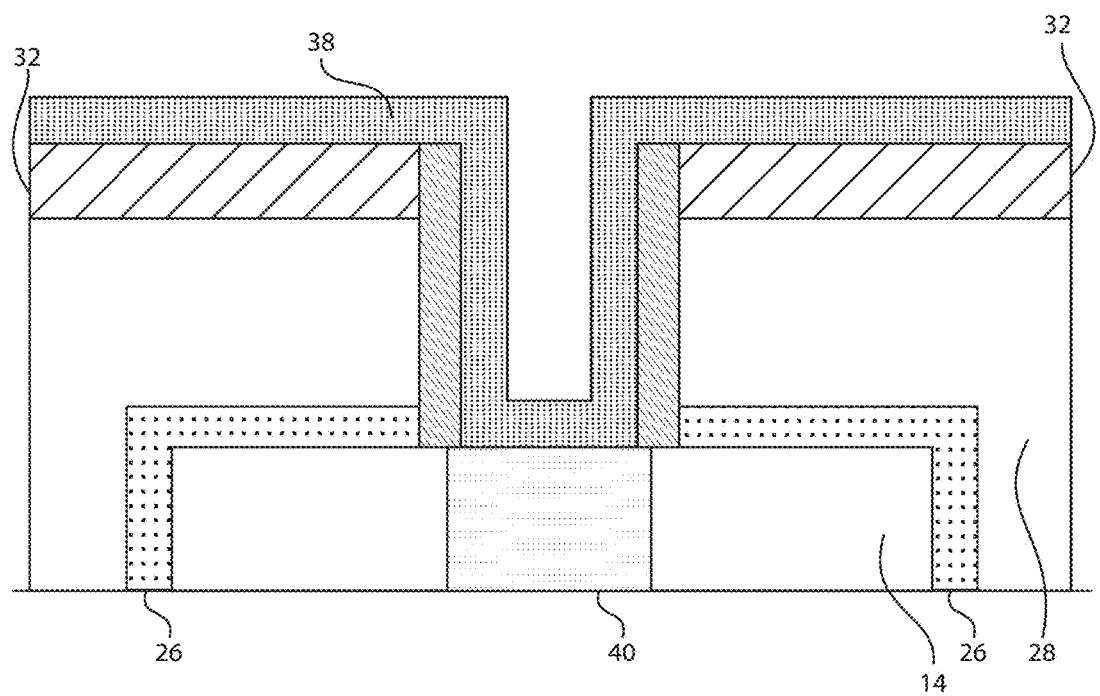
FIG. 9 is a cross-sectional view showing the device in FIG. 8 having the amorphous donor layer oxidized to condense out Ge and diffuse the Ge into the fin to form a channel region in accordance with the present principles.

Referring to FIG. 9, a diffusion process is performed on the donor layer 36 to form an oxide layer 38. The diffusion process includes a selective oxidation process that selectively oxidizes the Si, while Ge is diffused into the Si channel underneath to form a SiGe channel. The temperature can range from 400 to 1050 degrees C. with multi cycles. Each cycle is less than 60 seconds. Other anneal times and temperatures may also be employed.

The diffusion process may include exposing the donor layer 36 to oxygen or oxygen plasma at a temperature of between about 400 degrees C. to about 1050 degrees C. for one or more cycles. The process diffuses material into the fin 14 to form a channel 40 through condensation. The donor layer 36 preferably includes SiGe and oxidation has the effect of causing the Si in the SiGe layer 36 to form $SiO_2$, and the Ge to condense and diffuse into the fin 14 to form SiGe channel region 40. The donor layer 36, which may include amorphous SiGe, is conformal, and the fin shape can be maintained (e.g., facet free) during and after the diffusion process.

Here, facet free refers to a SiGe material that includes the original shape of the fin as formed and does not include faceted surfaces or structure outgrowths that deviate from the as-formed fin structure. The SiGe channel region 40 is formed by diffusion instead of by epitaxial growth. In this way, the fin 14 maintains its shape (the Si structure) faceting of the SiGe is avoided.

Figure 10:
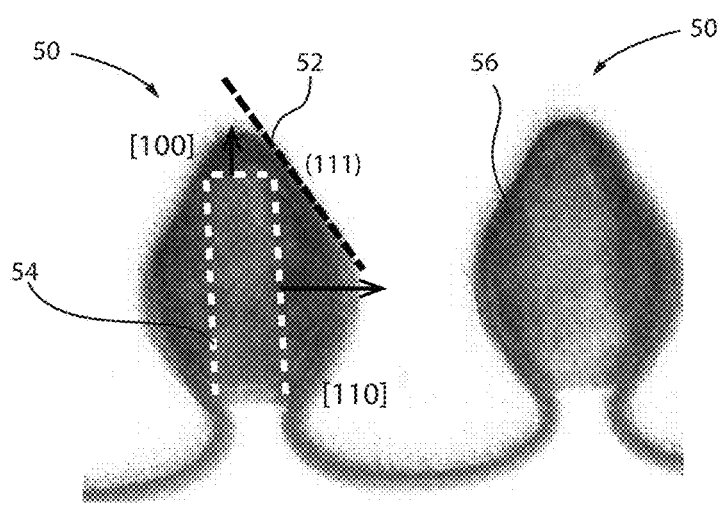
FIG. 10 shows an image of conventional fins formed by epitaxial growth forming a faceted and non-uniform Ge distribution in accordance with the prior art.

Referring to FIG. 10, conventional SiGe fins 50 on a [100] plane substrate are shown in cross-section in accordance with a prior art epitaxial growth process. The fins 50 show a (111) facet 52 formed relative to the [110] plane, which consists mainly of SiGe, formed on a Si core 54. Approximately, a faceted bulge 56 forms, which includes a non-uniform Ge distribution that can have a negative impact on device operation.

In accordance with the present principles, the fin 14 maintains a more uniform shape, and the Ge distribution in the channel region 40 is more uniform with a high concentration of Ge, e.g., between 10-100 atomic %. A high atomic percentage of Ge is useful for NFET devices, for example, about 90% Ge (in SiGe). A 10-50% atomic percent of Ge (in SiGe) is useful for PFET devices.

Figure 11:
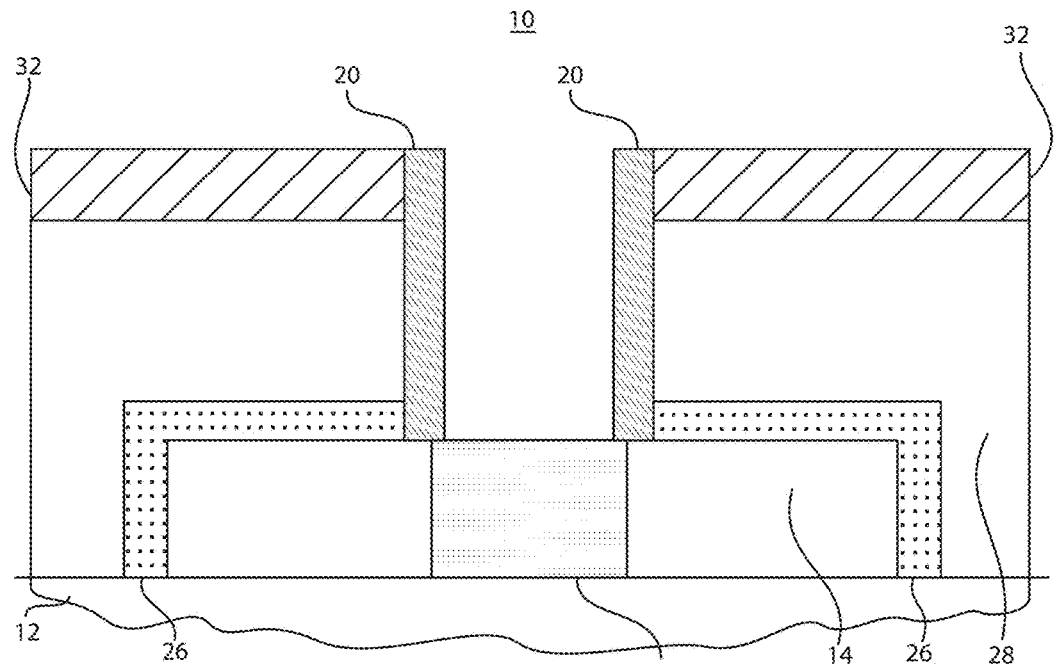
FIG. 11 is a cross-sectional view showing the device in FIG. 9 having the oxidized amorphous donor layer removed to expose the channel region in accordance with the present principles.

Referring to FIG. 11, the oxide layer 38 is removed to expose the SiGe channel 40. The oxide layer 38 may be removed using a reactive ion etch or other etching process.

Figure 12:
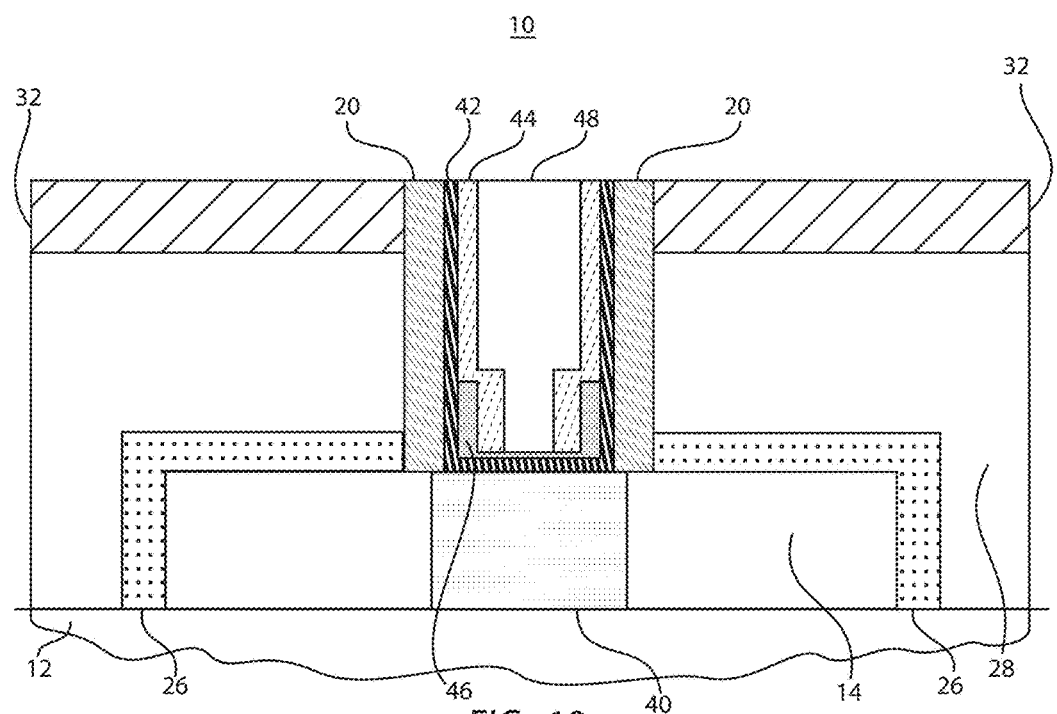
FIG. 12 is a cross-sectional view showing the device in FIG. 11 having a gate dielectric and a replacement gate formed in accordance with the present principles.

Referring to FIG. 12, with the channel region 40 formed, a replacement gate metal process is performed. A gate dielectric 42 is deposited over the channel region 40 and along spacers 20. The gate dielectric 42 preferably includes a high-k dielectric material, such as e.g., $HfO_2$ or the like. Then, a work function metal 46 is deposited and recessed within a gate region. The work function metal 46 may include, e.g., TiAl, TaN, TiN, HfN, HfSi, etc. An intermediary conductor 44 is formed over portions of the work function metal 46. The intermediary metal 44 is removed from a horizontal surface of the work function metal 46. The intermediary metal 44 may include, e.g., Al, Ti, Ta, or the like. A conductor 48 is deposited as the gate conductor. The conductor 48 may include W or other highly conductive metal. The conductor 48 contacts the intermediary conductor 44 and the work function metal 46. At least one CMP process is performed to planarize the top surface to remove gate dielectric and conductors down to the dielectric layer 32.

Figure 13:
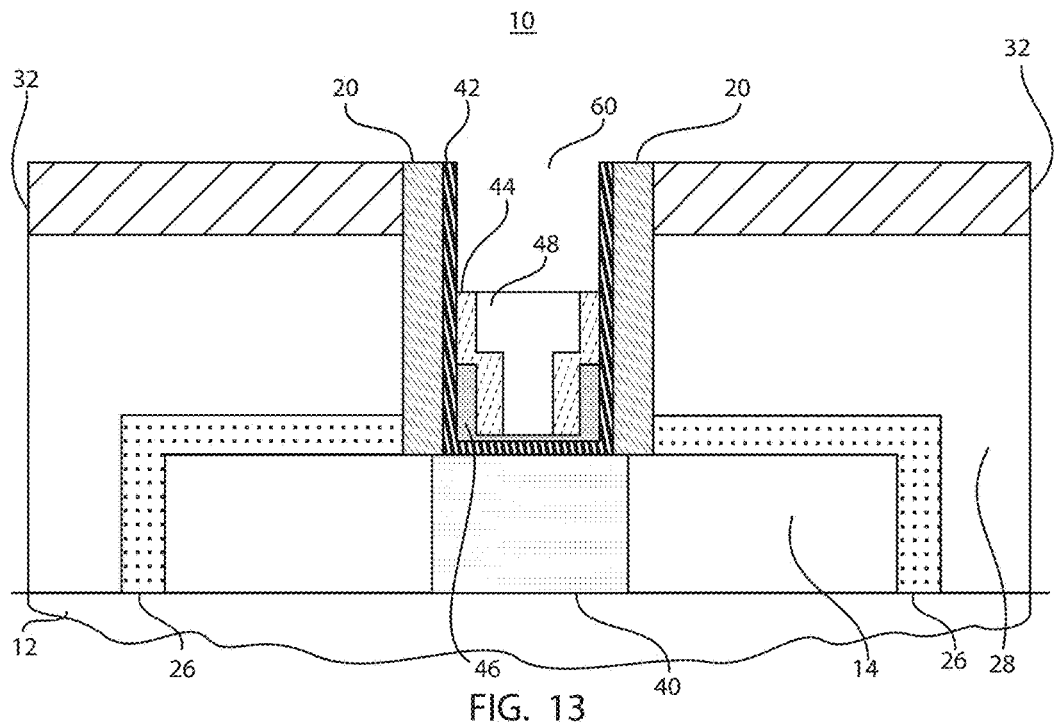
FIG. 13 is a cross-sectional view showing the device in FIG. 12 having a gate conductor of the replacement gate recessed in accordance with the present principles.

Referring to FIG. 13, a selective etch is performed to recess the gate conductor metals 46 and 48 into a gate opening or recess 60. The recess 60 provides space for the formation of a cap layer 62.

Figure 14:
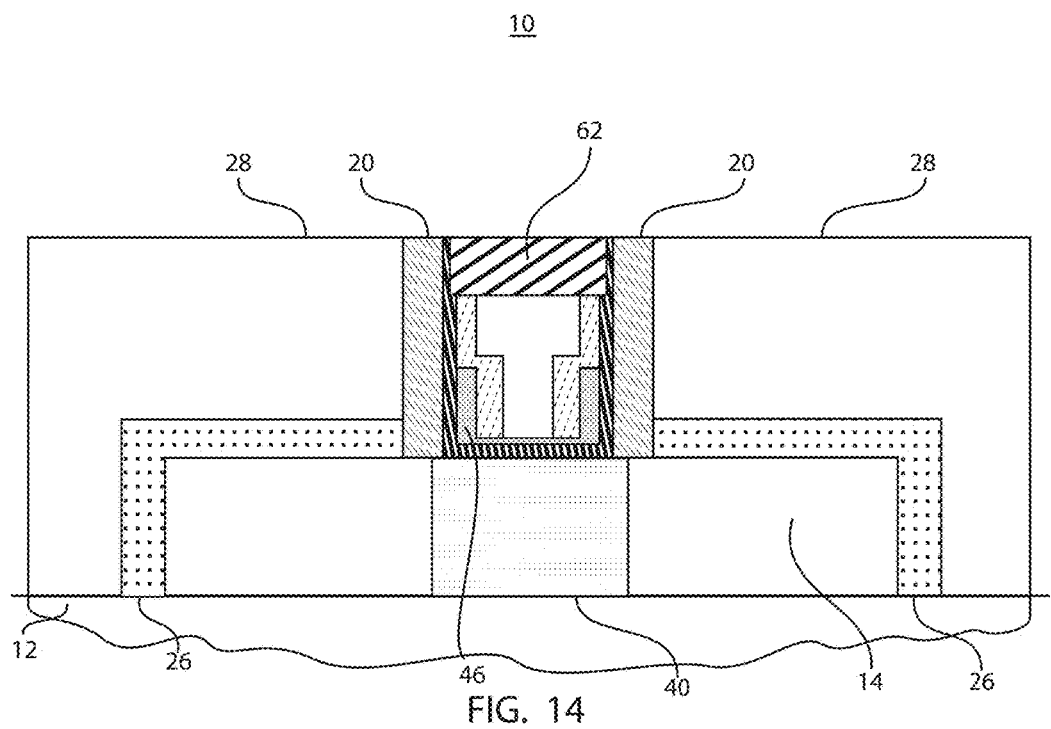
FIG. 14 is a cross-sectional view showing the device in FIG. 13 having a cap layer formed over the gate conductor of the replacement gate in accordance with the present principles.

Referring to FIG. 14, the cap layer 62 is deposited in the recess 60. The cap layer 62 may include a SiN material. The device 10 is then subjected to a CMP process to planarize a top surface and remove the dielectric layer 32.

Figure 15:
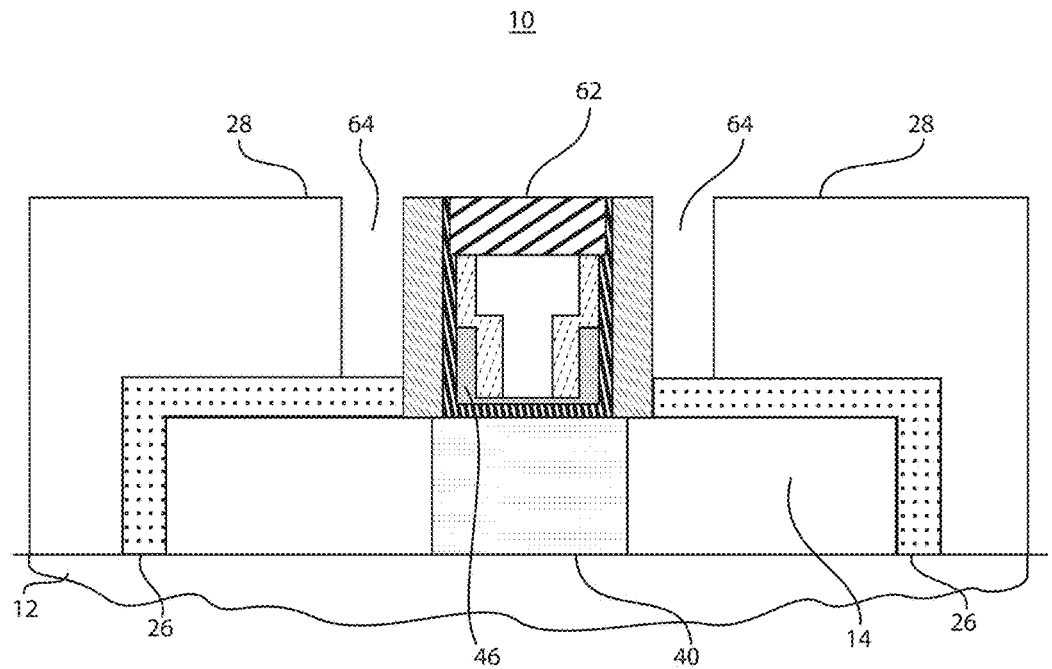
FIG. 15 is a cross-sectional view showing the device in FIG. 14 having contact holes formed in the dielectric fill in accordance with the present principles.

Referring to FIG. 15, contact holes 64 are formed in the fill material 28. The holes 64 are formed by providing a lithographic mask (not shown) and etching the holes 64, e.g., by a RIE process.

Figure 16:
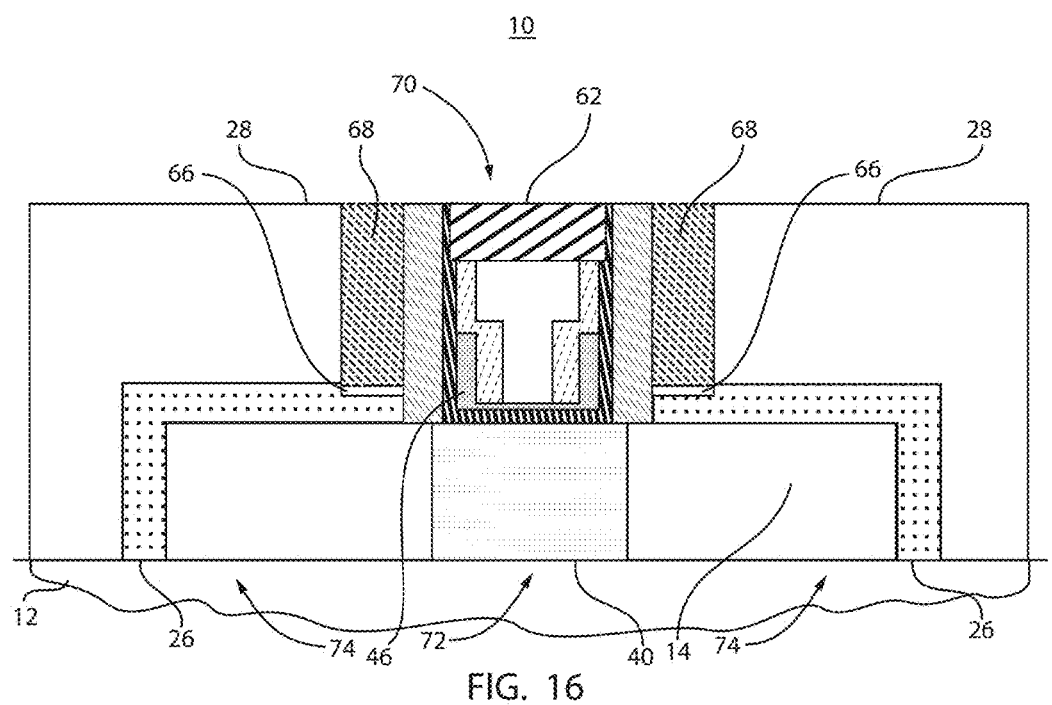
FIG. 16 is a cross-sectional view showing the device in FIG. 15 having contact liners and contacts formed in the dielectric fill in accordance with the present principles.

Referring to FIG. 16, contact liners 66 are formed at the bottom of the contact holes 64. The liners 66 may include a silicide material formed by mixing Ni, Ti, Pt, etc. with silicon. The liners 66 may also include a contact liner, which may include a layer of TaN, TiN, or the like formed in the contacts holes 64. A conductor 68 is deposited in the contact holes 64 to form contacts. The contacts 68 may include W, Al, Ti or other metals. A CMP process is performed to planarize a top surface and prepare for the formation of metallizations and other components.

A fin field effect transistor 10 is formed having a Si fin 14 including a central portion 72 between end portions 74 of the fin 14. A gate structure 70 is formed over the central portion 72 of the fin 14. A SiGe channel region 40 is disposed on or in the central portion 72 of the fin 14 corresponding to the gate structure 70. The channel region 40 is facet free SiGe having Ge atoms diffused into the Si fin 14. The channel region 40 includes a same shape (profile) as the Si fin outside the central portion (end portions 74). Source and drain regions 26 are formed on or in the fin 14 on opposite sides of the channel region 40. The channel region 40 may include about 10 to about 100 at % Ge. The channel region 40 preferably extends vertically from a top of the fin 14 to a bottom of the fin 14.

Figure 17:
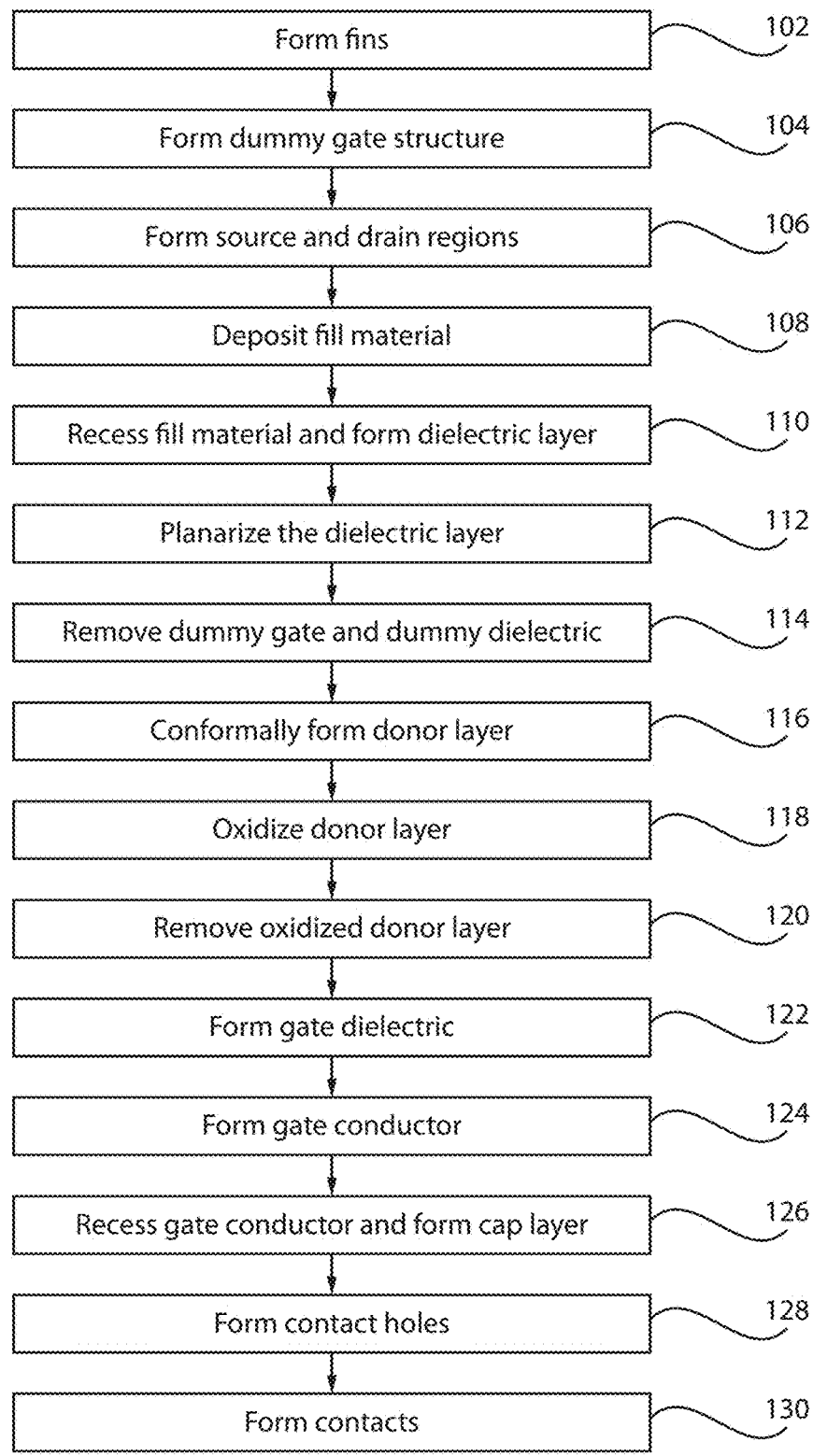
FIG. 17 is a block/flow diagram for a method for channel formation in a fin transistor in accordance with one or more illustrative embodiments.

Referring to FIG. 17, a method for channel formation in a fin transistor is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are formed on a dielectric layer (e.g., on a bulk wafer or as part of a SOI wafer). The fins preferably include monocrystalline Si. In block 104, a dummy gate structure is formed on or over the fins. The dummy gate structure may include a dummy gate dielectric, a dummy gate, a cap layer and sidewall spacers. In block 106, source and drain regions are formed on the fin adjacent to the sidewall spacers. This may include an epitaxial growth process to grow doped materials on opposite side of the dummy gate structure. In block 108, a fill material is formed over the dummy gate structures and the source and drain regions. The fill material may include an oxide. The fill material is planarized (e.g., by CMP). In block 110, the fill material is recessed to provide a region for the placement of a dielectric layer. In block 112, the dielectric layer is planarized to remove the cap layer and expose the dummy gate.

In block 114, the dummy gate and the dummy gate dielectric are removed from the dummy gate structure to expose a region of the fin. In block 116, a donor layer (e.g., an amorphous SiGe layer) is conformally deposited over the region of the underlying fin. In one embodiment, the channel region includes a substantially uniform SiGe that is facet free. The SiGe channel region maintains its as-formed Si fin shape without facet bulging. The amorphous SiGe layer includes 10-100 at % Ge.

In block 118, the donor layer (amorphous SiGe layer) is oxidized to condense out Ge and diffuse the Ge into the region of the fin to form a channel region including Ge. The oxidization process includes annealing the amorphous SiGe in the presence of oxygen at a temperature of between about 400 and about 1050 degrees C. for one or more cycles of less than 1 minute. The oxidization of the amorphous SiGe layer forms an oxide layer which is subsequently removed in block 120.

In block 122, a gate dielectric is formed on the channel region. In block 124, a gate conductor is formed on the gate dielectric. The gate conductor may include a plurality of materials including a work function metal, an intermediary material and a fill metal. In block 126, the gate conductor can be recessed and a cap layer may be formed on the gate structure. In block 128, after the dielectric layer is removed, contact holes are formed in the fill material. In block 130, contacts are formed in the contact holes. This may include forming a contact liner before filing the contact holes with a conductive fill.

It should be understood that the present principles may be employed in different ways or using different structures. For example, in one embodiment, a dummy gate structure may not be needed. Instead, a dielectric layer may be formed over a fin or other semiconductor material where Ge is to be diffused. The dielectric layer may be opened up at a location where a channel region is to be formed, and the amorphous SiGe layer may be conformally formed as described. The amorphous SiGe layer may then be oxidized to condense and diffuse the Ge into the semiconductor material as described. Other embodiments may be employed with structures that do not include fins and employ other materials other than SiGe and/or Si.

Having described preferred embodiments for silicon germanium fin channel formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for channel formation in a fin transistor, comprising:
removing a dummy gate and dummy gate dielectric from a dummy gate structure to expose a region of an underlying fin;
depositing an amorphous layer including Ge over the region of the underlying fin; and
oxidizing the amorphous layer to condense out Ge and diffuse the Ge into the region of the underlying fin to form a channel region with Ge in the fin.

2. The method as recited in claim 1, wherein oxidizing the amorphous layer forms an oxide layer and the method further comprises removing the oxide layer.

3. The method as recited in claim 2, further comprising:
forming a gate dielectric on the channel region; and
forming a gate conductor on the gate dielectric.

4. The method as recited in claim 1, further comprising forming source and drain regions on opposite sides of the channel region.

5. The method as recited in claim 1, wherein the channel region includes SiGe and is facet free.

6. The method as recited in claim 1, wherein the amorphous layer includes about 10 to about 100 at % Ge.

7. The method as recited in claim 1, wherein oxidizing the amorphous layer includes annealing the amorphous layer in the presence of oxygen at a temperature of between about 400 and about 1050 degrees C. for one or more cycles of less than about 1 minute.

* * * * *